(12) United States Patent
Krishnamoorthy et al.

(10) Patent No.: US 8,107,245 B1
(45) Date of Patent: Jan. 31, 2012

(54) PROXIMITY ACTIVE CONNECTOR AND CABLE

(75) Inventors: Ashok V. Krishnamoorthy, San Diego, CA (US); Arthur Zingher, San Diego, CA (US); Danny Cohen, Pacific Palisades, CA (US); Robert Drost, Mountain View, CA (US)

(73) Assignee: Oracle America, Inc., Redwood Shores, CA (US)

( * ) Notice: Subject to any disclaimer, the term of this patent is extended or adjusted under 35 U.S.C. 154(b) by 1629 days.

(21) Appl. No.: 11/165,996

(22) Filed: Jun. 24, 2005

Related U.S. Application Data

(63) Continuation-in-part of application No. 10/816,761, filed on Apr. 2, 2004, now Pat. No. 6,987,412.

(60) Provisional application No. 60/582,881, filed on Jun. 25, 2004.

(51) Int. Cl.
*H05K 7/00* (2006.01)

(52) U.S. Cl. ......... 361/734; 361/760; 361/776; 257/724

(58) Field of Classification Search .................. 361/760, 361/776, 734; 257/724, 723, 686, 784, 664, 257/728, 684, 700, 752, 777; 324/754, 755, 324/658, 660, 690, 686; 438/171, 190, 210, 438/329, 239; 333/245–248
See application file for complete search history.

(56) References Cited

U.S. PATENT DOCUMENTS

| | | | | |
|---|---|---|---|---|
| 5,629,838 A | * | 5/1997 | Knight et al. | 361/782 |
| 5,751,977 A | * | 5/1998 | Alexander | 710/310 |
| 5,956,370 A | * | 9/1999 | Ducaroir et al. | 375/221 |
| 6,559,531 B1 | * | 5/2003 | Sutherland | 257/686 |
| 6,728,113 B1 | | 4/2004 | Knight et al. | 361/760 |
| 6,916,719 B1 | | 7/2005 | Knight et al. | 438/381 |
| 6,956,847 B2 | * | 10/2005 | Heston et al. | 370/353 |
| 7,053,466 B2 | * | 5/2006 | Prokoflev et al. | 257/662 |
| 2004/0018654 A1 | * | 1/2004 | Drost et al. | 438/17 |

* cited by examiner

*Primary Examiner* — Hoa C Nguyen
(74) *Attorney, Agent, or Firm* — Park, Vaughan, Fleming & Dowler LLP

(57) ABSTRACT

A system that facilitates high-speed signaling between integrated circuit chips comprising a cable, wherein the cable includes a first and second active connector that facilitate communication between integrated circuit chips. The first active connector includes a capacitive receiver which receives a signal from a corresponding capacitive transmitter located on a first integrated circuit chip through capacitive coupling, and a transmitter which transmits a signal received by the capacitive receiver, through the interconnect medium within the cable, to the second active connector. The second active connector includes a receiver which receives a signal transmitted through the interconnect medium of the cable, and a capacitive transmitter which transmits the signal to a corresponding capacitive receiver located on a second integrated circuit chip through capacitive coupling. Note that the capacitive receivers are not permanently attached to the capacitive transmitters, whereby the cable can be easily remated to other integrated circuit chips.

19 Claims, 2 Drawing Sheets

PROXIMITY ACTIVE CONNECTOR AND CABLE

RELATED APPLICATION

This application is a continuation-in-part of a pending U.S. patent application, entitled "Sense Amplifying Latch With Low Swing Feedback," by inventor Ivan E. Sutherland, Robert J. Bosnyak, and Robert J. Drost, having Ser. No. 10/816,761 and a filing date of 2 Apr. 2004 now U.S. Pat. No. 6,987,412. This application hereby claims priority under 35 U.S.C. §120 to the above-listed patent application. Moreover, the above-listed application is hereby incorporated by reference. This application also hereby claims priority under 35 U.S.C. §119 to U.S. Provisional Patent Application No. 60/582,881 filed 25 Jun. 2004, entitled "Proximity Active Connector and Cable," by inventors Ashok V. Krishnamoorthy, Arthur R. Zingher, Danny Cohen, and Robert J. Drost.

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

1. Field of the Invention

The present invention relates to techniques for communicating between integrated circuit chips. More specifically, the present invention relates to a cable that uses active connectors and capacitive coupling to facilitate high-speed signaling between integrated circuit chips.

2. Related Art

Advances in semiconductor technology presently make it possible to integrate large-scale systems, including tens of millions of transistors, onto a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

However, these semiconductor chips still need to communicate with other chips, and unfortunately, these advances in semiconductor technology have not been matched by corresponding advances in inter-chip communication technology. Semiconductor chips are typically mounted onto a printed circuit board that contains multiple layers of signal lines for inter-chip communication. However, a semiconductor chip can contain about 100 times to 1000 times more signal lines than a printed circuit board. Consequently, only a tiny fraction of the signal lines on a semiconductor chip can be routed across the printed circuit board to other chips. This problem is creating a bottleneck that is expected to worsen as semiconductor integration densities continue to increase.

To overcome this communication bottleneck, researchers have recently developed an alternative technique, known as "Proximity Communication," to communicate between semiconductor chips. Proximity Communication can be implemented by integrating arrays of capacitive transmitters and receivers onto active surfaces of integrated circuit (IC) chips to facilitate inter-chip communication. If a first chip is situated face-to-face with a second chip so that transmitter regions on the first chip are capacitively coupled with receiver regions on the second chip, it is possible to transmit signals directly from the first chip to the second chip without having to route the signal through intervening signal lines within a printed circuit board. The advantage of such an arrangement is that a large number electronic terminals on one chip can each communicate with corresponding electronic terminals on the other chip.

Proximity Communication makes it possible to communicate an extremely large bandwidth per unit area. For example, the size and center-to-center pitch of Proximity Communication terminals in an exemplary implementation can be 20 microns and 30 microns, respectively. Under Proximity Communication, signals travel in the direction normal to the surface of the chip. Therefore, Proximity Communication allows communication to take place across a fully populated two-dimensional array of terminals, with many rows and many columns.

For comparison purposes, the size and pitch of a typical wire bond terminal may be 100 microns on a side with a pitch of 150 microns from the center of one terminal to the neighboring terminal. Furthermore, wire bonds are typically limited to a few rows. Hence, wire bonds generally do not enable a large fully populated two-dimensional array of terminals. Also, wire bonds are permanent, and do not permit rematabilty of connectors. (Note that term "rematability" refers to the ability to connect, disconnect, and reconnect terminals under field conditions.)

Proximity communication works well for chips that are located in close proximity to each other. Unfortunately, when chips need to communicate with other chips father away, a cable must be used. Passive electrical cables have long been used to interconnect active circuits within a digital system. The density of such connections is typically limited by the physical cabling structure, and specifically by the connection endpoints, due to the connection density of the attachment mechanism. Signal deterioration caused by impedance mismatches and electrical near-end crosstalk are major problems that limit the density and bit-rate of inter-chip communication at the board and backplane levels of the interconnect hierarchy. Furthermore, high insertion forces are often required due to the need to simultaneously connect a large number of copper pins to their corresponding mating receptacles. The electronic properties of the connectors, such as cross-coupling and impedance mismatch, often degrade or limit signal quality and reliability. Yet another limitation of conventional connectors is that they typically are designed for remateable connections at the printed circuit board level. However, these connectors are not suitable for detachable connection to an individual IC chip. Accordingly, these effects often limit the maximum density and maximum bandwidth of these board-to-board connections.

In addition to the connector limitations, passive electrical cables between boards are typically driven by transmitters and corresponding receivers that are located on the transmitting and receiving boards, respectively. Thus, the transmitter must typically drive the output connector on the transmitting board, the entire length of the cable, and the input connector on the receiving board. A particular transmitter/receiver pair must be carefully tested and verified for a variety of system applications, which may involve different types of connector and cables. Such verification is valid for a particular length and type of cable, and may be invalid for another cable length or type. Therefore, to ensure that the circuit can drive the cable, retesting and redesign is necessary when changing the cable length or type.

Because of the large number of choices of connectors, cable types, and cable lengths, it is exceedingly difficult to verify that all possible combinations are allowable. The burden is on the system designer to laboriously determine through analysis, simulation, and experimentation if the specific system design will work within acceptable margins.

In stark contrast to the scaling of connectors, the bit-rates and achievable density of on-chip-level interconnect has been progressing rapidly to the point that there is a substantial mismatch of several orders of magnitude between the density of electrical signaling on-chip versus that which can be achieved off-chip.

Hence, what is needed is an apparatus for communicating between integrated circuits without the problems described above.

SUMMARY

One embodiment of the present invention provides a system that facilitates high-speed signaling between integrated circuit chips. The system comprises a cable, wherein the cable includes a first active connector and a second active connector that facilitate communication between integrated circuit chips. The first active connector includes a capacitive receiver which receives a signal from a corresponding capacitive transmitter located on a first integrated circuit chip through capacitive coupling, and a transmitter which transmits a signal received by the capacitive receiver, through the interconnect medium within the cable, to the second active connector. The second active connector includes a receiver which receives a signal transmitted through the interconnect medium of the cable, and a capacitive transmitter which transmits the signal to a corresponding capacitive receiver located on a second integrated circuit chip through capacitive coupling. Note that the capacitive receiver is not permanently attached to the capacitive transmitter in the first integrated circuit chip and the capacitive transmitter is not permanently attached to the capacitive receiver on the second integrated circuit chip, whereby the cable can be easily remated to other integrated circuit chips.

In a variation on this embodiment, the system facilitates bi-directional communication. In this embodiment, the second active connector additionally includes a capacitive receiver which receives a signal from a corresponding capacitive transmitter located on a second integrated circuit chip through capacitive coupling. It also includes a transmitter which transmits a signal received by the capacitive receiver, through the interconnect medium within the cable, to the first active connector. The first active connector additionally includes a receiver which receives a signal transmitted through the interconnect medium of the cable, and a capacitive transmitter which transmits the signal from the receiver to a corresponding capacitive receiver located on a first integrated circuit chip through capacitive coupling In a variation on this embodiment, a mechanical self-alignment mechanism within the cable provides coarse alignment and large range of motion to facilitate aligning the cable with the integrated circuit chip.

In a variation on this embodiment, an electrical self-alignment mechanism within the cable, which includes electronic verniers and an electronic alignment correction mechanism, provides fine alignment to facilitate aligning the cable with the integrated circuit chip.

In a variation on this embodiment, the system contains an out-of-band communication mechanism within the cable and an out-of-band communication mechanism within the integrated circuit chip. These out-of-band communication mechanisms are used by the cable and the IC chip to negotiate which pad pitches, pad locations, and signaling rates to use.

In a variation on this embodiment, the first and the second active connectors communicate with the first and the second integrated circuit chips through inductive coupling.

In a variation on this embodiment, the first and the second active connectors communicate with the first and the second integrated circuit chips through optical coupling.

In a variation on this embodiment, the system contains an interposer mechanism between the first active connector and the first integrated circuit chip, which increases coupling strength between the first active connector and the first integrated circuit chip.

In a variation on this embodiment, the first active connector additionally includes a protocol and buffering mechanism, which translates and buffers signals; a clock and data recovery circuit, which facilitates recovery of data; a serializer mechanism, which converts data into a serial stream of bits; and a deserializer mechanism, which reconstructs the serial stream of bits back to the original data format.

In a variation on this embodiment, the second active connector additionally includes a protocol and buffering mechanism, which translates and buffers signals; a clock and data recovery circuit, which facilitates recovery of data; a serializer mechanism, which converts data into a serial stream of bits; and a deserializer mechanism, which reconstructs the serial stream of bits back to the original data format.

DETAILED DESCRIPTION

The following description is presented to enable any person skilled in the art to make and use the invention, and is provided in the context of a parti-cular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Active Connector and Active Cable

The present invention provides a remateable active cable with active connectors. The active connectors includes transmitter and receiver circuits to capacitively couple signals across a small gap between corresponding terminals of the IC chips that are in close proximity to the connectors. This can provide high-speed, high-density connections directly from the surface of a first integrated circuit (IC) chip, through a cable of arbitrary distance, to the surface of a second IC chip.

In one embodiment of the present invention, an active connector provides a predictable input impedance and a predictable input threshold. An active connector also provides a predictable output impedance and a predictable signal strength. The signal properties of these connectors are independent of the length and type of the cable. Thus, the active connectors and the active cable can encapsulate and hide the analog requirements that depend upon the length and type of the cable.

In one embodiment of the present invention, the active connector provides a separable, remateable bidirectional connection directly to the surface of an IC chip and operates on the basis of capacitive coupling of signals from the chip to the connector. When fully mated and aligned, there is proximity between terminals in the active connector and the IC chip which allows signals to be communicated through capacitive coupling. These active connectors can be mated, disconnected and mated again in a wide range of environments using relatively simple tools and easy procedures. If desired, this mating cycle can be repeated many times.

Figure 1:
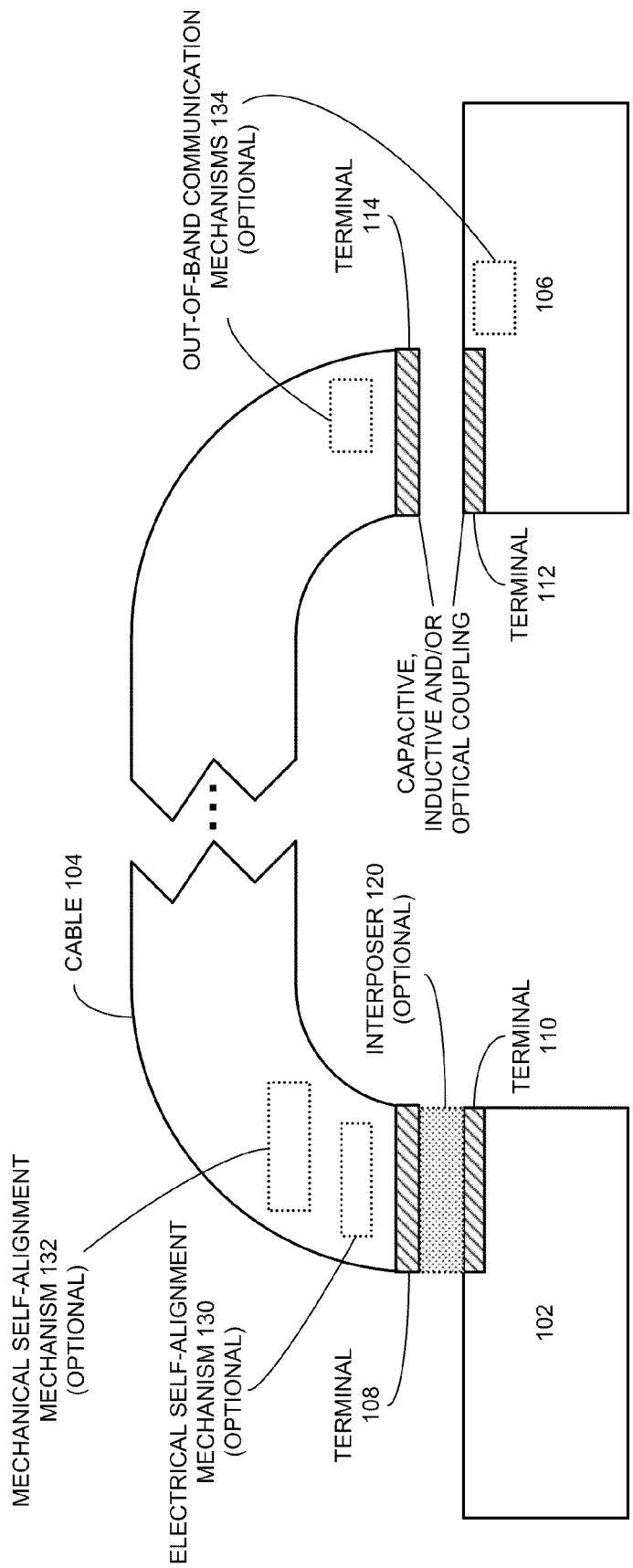
FIG. 1 illustrates an active cable coupled between two integrated circuit chips in accordance with an embodiment of the present invention.

FIG. 1 illustrates an active cable coupled between two IC chips in accordance with an embodiment of the present invention. It contains integrated circuit chips 102 and 106, cable 104, and terminals 108, 110, 112, and 114.

Terminals 108 and 110 communicate with each other through capacitive coupling. Similarly, terminals 112 and 114 communicate with each other through capacitive coupling. Cable 104 carries signals transmitted between integrated circuit chips 102 and 106. As will be discussed in detail later, an optional interposer mechanism 120 can increase coupling strength between an active connector and an integrated circuit chip. Also, optional electrical self-alignment mechanism 130 and mechanism self-alignment mechanism 132 within cable 104 can facilitate aligning cable 104 with the integrated circuit chip 102 (these mechanisms will be described in more detail later in this paper). Moreover, as will be discussed in detail later, cable 104 and integrated circuit chip 102 (and/or 106) can include out-of-band communication mechanisms. And, note that for illustrative purposes we describe terminals 108-114 as communicating through capacitive coupling, although, as will be discussed later in this paper, these terminals can also include (and communicate through) inductive and/or optical coupling.

Note that a substantial fraction of the chip surface can be used for Proximity Communication. This affords the ability to achieve the capacitive coupling using terminal sizes that are specifically optimized to preserve signal integrity and to ease alignment between corresponding terminals.

In one embodiment of the present invention, the terminals are fully populated 2D arrays, with a pitch 250 microns by 250 microns. This pitch is convenient for alignment. In one embodiment of the present invention, the gap perpendicular to the chip is up to about 200 microns, and the mechanical tolerance parallel to the chip is about ±100 microns. Note that it is feasible to make fiber bundles with fibers spaced at this pitch. Thus, terminal density can be 1600 terminals/cm$^2$.

The bandwidth per channel depends on the IC technology, particularly its lithography ground-rule. At 180 nanometers or 90 nanometers, each terminal contributes a bandwidth of 4 Gigabit per second or 10 Gigabit per second per terminal. Thus, in one embodiment of the present invention the Proximity Communication bandwidth density can be 6.4 Terabits to 16 Terabits per second per cm$^2$. Thus, the aggregate bandwidth per area can be extremely large.

Note that the present invention achieves high-density connections directly to an IC chip using low insertion force to realize the connections.

One embodiment of the present invention provides a cable with an embedded driver/receiver matched to the type and length of the cable. Thus, the transmitter and receiver on the respective transmitting and receiving boards need only be tested with the particular connector, and can achieve performance goals independent of the type and length of cable.

Figure 2:
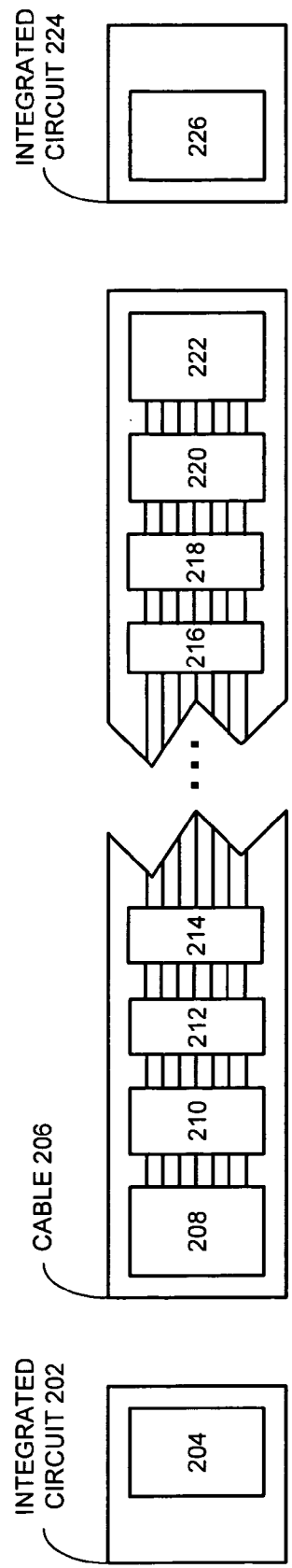
FIG. 2 illustrates components within an active cable in accordance with an embodiment of the present invention.

The bi-directional active connector and active cable assembly contain circuits that amplify, translate, and reformat the signals. FIG. 2 illustrates components within an active cable in accordance with an embodiment of the present invention. It contains integrated circuits 202 and 224, proximity communication circuits 204, 208, 222, and 226, protocol and buffering circuits 210 and 220, clock and data recovery circuits and serializer/deserializer circuits 212 and 218, and transmitters and receivers 214 and 216.

Note that proximity communication circuits 204, 208, 222, and 226 contain capacitive terminals to facilitate communication through capacitive coupling. Also note that the proximity communication circuits contain capacitive transmitters and receivers that amplify the signals transmitted and received at these terminals. In one embodiment of the present invention, the proximity communication circuits contain inductive terminals to facilitate Proximity Communication through inductive coupling. In another embodiment of the present invention, the proximity communication circuits contain optical terminals to facilitate Proximity Communication through optical coupling.

In FIG. 2, integrated circuit 202 transmits a signal from proximity communication circuit 204 to cable 206. Proximity communication circuit 208 receives the signal through capacitive coupling and amplifies this capacitively coupled signal. Protocol and buffering circuit 210 then translates and buffers this signal and sends it to clock and data recovery circuit and serializer/deserializer circuit 212. The clock and data recovery circuit retimes the data, and the serializer/deserializer circuit converts the data into a serial stream of bits. Next, transmitter 214 transmits the signal through the interconnect medium of the cable.

At the other end of the cable, receiver 216 receives the transmitted signal and sends the signal to clock and data recovery circuit and serializer/deserializer circuit 218. The serializer/deserializer circuit reconstructs the serial stream of bits to the original data format, and the clock and data recovery circuit retimes and recovers the data from the stream of bits. Protocol and buffering circuit 220 buffers and translates the signal received from clock and data recovery circuit and serializer/deserializer circuit 218. It then sends the signal to proximity communication circuit 222, which amplifies and transmits the signal to proximity communication circuit 226 on integrated circuit 224. Note that the signal is relayed across a cable of arbitrary length.

In one embodiment of the present invention, these functions are combined onto a single IC chip within the cable.

In one embodiment of the present invention, the remateable active connector and active cable provides full-duplex, bi-directional communication between the respective IC chips. In other words, a signal can be transmitted from integrated circuit 224 to integrated circuit 202 simultaneously with a signal being transmitted from integrated circuit 202 to integrated circuit 224.

One embodiment of the present invention uses Proximity Communication circuits for achieving an active, high-density connector, and a flexible electrical cable with corresponding electrical and proximity communication transmitter and receiver circuits. The cable includes one or more communication channels, such as metal wires on a flexible printed circuit board or micro-shielded electronic wires. In another embodiment of the present invention, the active electrical connector and cable includes electrical-to-optical transceivers and a cable that includes optical waveguides for driving optical signals across substantially greater distances.

In one embodiment of the present invention, the active connector uses capacitive coupling. In another embodiment of the present invention, the active connector uses inductive coupling between small magnetic terminals. In yet another embodiment of the present invention, the active connector uses ultra-short range optical coupling.

In one embodiment of the present invention, the cable carries optical signals over longer lengths through optical fibers. In one embodiment of the present invention, the cable carries electromagnetic signals over shorter lengths through micro-transmission lines, such as a bundle of micro-coaxial wires/cables, or a flexible ribbon cable with printed transmission lines on one or more layers. In yet another embodiment of the present invention, the cable carries optical signals using free space optical communication. Note that the active connectors encapsulate and hide the type of the cable, so the mating connectors can be independent of the cable length and type.

Self-Alignment

In one embodiment of the present invention, the active connectors self-align with each other using mechanical self-alignment and electronic self-alignment as the pair is mated together. Note that electrical self-alignment includes electronic sensing and electronic switching to correct the alignment. One embodiment of the present invention uses mechanical self-alignment for relatively coarse alignment and relatively large range, and uses electronic verniers and electronic alignment correction for fine self-alignment. Using both mechanical and electrical self-alignment together provides self-alignment over a wide range with fine accuracy.

Cable Geometry

In one embodiment of the present invention, the active connector and active cable assembly connects two IC chips in a one-to-one, bi-directional interconnection configuration. In another embodiment of the present invention, the active connector and active cable assembly fans out the signals from a central IC chip to multiple physically separate destination IC chips in a one-to-many, bi-directional interconnection configuration.

In one embodiment of the present invention, the pitch of the Proximity Communication pads is fixed and dependent on the expected mechanical alignment tolerance and electrical alignment correction capabilities. For example, the pitch may be 10 to 20 microns for an active connector with precision mechanical alignment, or 100 to 300 microns for an active connector with relaxed mechanical alignment. Note that other pitches that are larger, smaller, or between these ranges may be appropriate for other applications.

In one embodiment of the present invention, the pad pitch is variable in either the active connector or active cable. Variable pitch pads in the active connector accommodate a range of active cable pad pitches. Conversely, variable pitch pads in the active cable accommodate a range of active connector pad pitches. In one embodiment of the present invention, both active connector and active cable have variable pad pitches so that they can interoperate over any range of compatible pad pitches.

In one embodiment of the present invention, the variable pad pitch is constructed by grouping different numbers of micropads into channels.

In one embodiment of the present invention, the active cable and active connector include an out-of-band communication mechanism to communicate the allowable pad pitches. In one embodiment of the present invention, the out-of-band communication mechanism communicates other useful information. For example, the active cable can declare its latency, the locations of Proximity pads, and the signaling rate. Similarly, the active connector can declare its locations of Proximity pads and the signaling rate.

In one embodiment of the present invention, the active connector and active cable negotiate on agreeable pad pitches, pad locations, and signaling rates using the out-of-band communication mechanism.

In one embodiment of the present invention, the active cable and active connector includes additional redundant paths and redundant sub-components, such as memory elements, buffers, electrical drivers and receivers, optical drivers and receivers, optical fibers and electrical wires.

In one embodiment of the present invention, the out-of-band communication mechanism is used to control or monitor the redundant subcomponents to permit the system to bypass failing sub-components with redundant elements.

In one embodiment of the present invention, a system controller that provides reactive or proactive handling of partially failing or completely failed components monitors the status or health of the active connector and active cable.

Interposers

In one embodiment of the present invention, the active connector or active cable, or both include an interposer or interposers designed to increase the coupling between the Proximity Communication circuits. The interposers include: isotropic interposers intended to uniformly increase dielectric coupling; anisotropic interposers that increase dielectric coupling between pads in one channel and limit dielectric coupling to neighboring channels; and interposers that utilize anisotropic conductive components such as embedded metal particles or micro-electromechanical components that increase the desired coupling between pads and limit the undesired coupling to neighboring pads. Note that the interposers reduce the mechanical alignment precision requirements for the connector and cable mating assembly by permitting larger gaps between Proximity Communication circuits on the active connector and active cable.

Cable Latency

Cable length and propagation delay through the cable cause latency. The round-trip latency time is a fundamental part of the handshake interval.

The flow control unit (flit) is the amount of data that is transferred together, as an atomic operation. A flit may range from a single bit to a large number of bits, particularly if several signal paths are used concurrently. If every flit is individually acknowledged before the next one is transmitted, then transit time may limit the usable bandwidth.

There are several techniques to achieve the maximum effective bandwidth, in spite of the cable latency, while also preventing data overflow and underflow (also known as "starvation"). One technique uses "credit-based transmission" and another uses "high/low water marks". These techniques require buffers whose size scales with the cable latency. In general, the specific cable length is unknown when the connected devices are designed. Therefore, these buffers are designed for an assumed maximum cable length. However, if the cable is shorter then the assumed maximum cable length, this buffer wastes latency and usable bandwidth.

In contrast, the present invention enables the active cable and active connectors to be designed as a functional unit. This technique allows the active connector design to match the specific cable length. In particular, this enables flow control buffers that correspond closely to the specific cable length.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus that facilitates high-speed signaling between integrated circuit chips, comprising:
   an electrical cable, wherein the cable includes a first active connector that facilitates communication between integrated circuit chips;
   wherein the first active connector includes:
      a capacitive receiver which receives a signal from a corresponding capacitive transmitter located on a first integrated circuit chip through capacitive coupling; and
      a transmitter which transmits a signal received by the capacitive receiver, through an interconnect medium within the cable, wherein the transmitter includes at least one of a driver or a transmit buffer that is configured with a size that is set corresponding to a length of the cable; and
   an out-of-band communication mechanism within the cable and an out-of-band communication mechanism within the integrated circuit chips, wherein the cable and the integrated circuit chips use the out-of-band communication mechanisms to negotiate which pad pitches, pad locations, and signaling rates for facilitating communication between the integrated circuit chips and the first active connector;
   wherein the capacitive receiver is not permanently attached to the capacitive transmitter in the first integrated circuit chip, whereby the cable can be easily remated to other integrated circuit chips.

2. The apparatus of claim 1, wherein the cable includes a second active connector which includes:
   a receiver which receives a signal transmitted through the interconnect medium of the cable; and
   a capacitive transmitter which transmits the signal from the receiver to a corresponding capacitive receiver located on a second integrated circuit chip through capacitive coupling;
   wherein the capacitive transmitter is not permanently attached to the capacitive receiver on the second integrated circuit chip, whereby the cable can be easily remated to other integrated circuit chips.

3. The apparatus of claim 2,
   wherein the cable is bi-directional;
   wherein the second active connector additionally includes:
      a capacitive receiver which receives a signal from a corresponding capacitive transmitter located on a second integrated circuit chip through capacitive coupling; and
      a transmitter which transmits a signal received by the capacitive receiver, through the interconnect medium within the cable, to the first active connector;
   wherein the first active connector additionally includes:
      a receiver which receives a signal transmitted through the interconnect medium of the cable; and
      a capacitive transmitter which transmits the signal from the receiver to a corresponding capacitive receiver located on a first integrated circuit chip through capacitive coupling.

4. The apparatus of claim 2, wherein the second active connector additionally includes:
   a protocol and buffering mechanism, which translates and buffers signals;
   a clock and data recovery circuit, which facilitates recovery of data;
   a serializer mechanism, which converts data into a serial stream of bits; and
   a deserializer mechanism, which reconstructs the serial stream of bits back to the original data format.

5. The apparatus of claim 1, wherein the interconnect medium of the cable is coupled to a receiver located on a hardware module which receives a signal transmitted through the interconnect medium of the cable.

6. The apparatus of claim 5,
   wherein the cable is bi-directional;
   wherein the hardware module additionally includes:
      a transmitter which transmits a signal received by the hardware module, through the interconnect medium within the cable, to the first active connector;
   wherein the first active connector additionally includes:
      a receiver which receives a signal transmitted through the interconnect medium of the cable; and
      a conductive transmitter which transmits the signal from the receiver to a corresponding conductive receiver located on a first integrated circuit chip through conductive coupling.

7. The apparatus of claim 1, further comprising using mechanical self-alignment to provide coarse alignment and large range of motion to facilitate aligning the cable with the integrated circuit chip.

8. The apparatus of claim 1, further comprising an electrical self-alignment mechanism within the cable, which comprises electronic verniers and an electronic alignment correction mechanism, to provide fine alignment to facilitate aligning the cable with the integrated circuit chip.

9. The apparatus of claim 1, further comprising, an interposer mechanism between the first active connector and the first integrated circuit chip, wherein the interposer mechanism increases coupling strength between the first active connector and the first integrated circuit chip.

10. The apparatus of claim 1, wherein the first active connector additionally includes:
    a protocol and buffering mechanism, which translates and buffers signals;
    a clock and data recovery circuit, which facilitates recovery of data;
    a serializer mechanism, which converts data into a serial stream of bits; and
    a deserializer mechanism, which reconstructs the serial stream of bits back to the original data format.

11. The apparatus of claim 1, wherein the cable is configured so that the interconnect medium is a flexible wire, and wherein the transmitter is configured to transmit the signal on the electrical wire using an electrical signal.

12. The apparatus of claim 1, wherein the flexible electrical cable is bent into a U-shape.

13. A method that facilitates high-speed signaling between integrated circuit chips, comprising:
    using an out-of-band communication mechanism within a first active connector within an electrical cable and an out-of-band communication mechanism within the integrated circuit chip to negotiate pad pitches, pad locations, and signaling rates for facilitating communication between the integrated circuit chip and the first active connector;
    receiving a signal through capacitive coupling at a capacitive receiver located in the first active connector within the electrical cable from a capacitive transmitter located on a first integrated circuit chip; and
    transmitting the signal through an interconnect medium within the cable using a transmitter, wherein the transmitter includes at least one of a driver or a transmit buffer that is configured with a size that is set corresponding to a length of the cable;

wherein the capacitive receiver is not permanently attached to the capacitive transmitter in the first integrated circuit chip, whereby the cable can be easily remated to other integrated circuit chips.

14. The method of claim 13, further comprising:
receiving the signal transmitted through the interconnect medium of the cable at a receiver in a second active connector; and
using a capacitive transmitter to transmit the signal to a corresponding capacitive receiver located on a second integrated circuit chip through capacitive coupling;
wherein the capacitive transmitter is not permanently attached to the capacitive receiver on the second integrated circuit chip, whereby the cable can be easily remated to other integrated circuit chips.

15. The method of claim 14, further comprising transmitting a signal in the reverse direction by:
receiving a signal through capacitive coupling at a capacitive receiver located in the second active connector from a capacitive transmitter located on the second integrated circuit chip;
transmitting the signal through the interconnect medium within the cable to the first active connector within the cable using a transmitter;
receiving the signal transmitted through the interconnect medium of the cable at a receiver in the first active connector; and
using a capacitive transmitter to transmit the signal through capacitive coupling to a corresponding capacitive receiver located on a first integrated circuit chip.

16. The method of claim 13, further comprising receiving the signal transmitted through the interconnect medium of the cable at a receiver located on a hardware module.

17. The method of claim 16, further comprising transmitting a signal in the reverse direction by:
transmitting the signal through the interconnect medium within the cable to the first active connector within the cable using a transmitter located on the hardware module;
receiving the signal transmitted through the interconnect medium of the cable at a receiver in the first active connector; and
using a capacitive transmitter to transmit the signal through capacitive coupling to a corresponding capacitive receiver located on a first integrated circuit chip.

18. The method of claim 13, wherein the first and the second active connectors communicate with the first and the second integrated circuit chips through optical coupling.

19. A computer system that facilitates high-speed signaling between integrated circuit chips, comprising:
a processor;
an electrical cable, wherein the cable includes a first active connector that facilitates communication between integrated circuit chips;
wherein the first active connector includes:
a capacitive receiver which receives a signal from a corresponding capacitive transmitter located on a first integrated circuit chip through capacitive coupling; and
a transmitter which transmits a signal received by the capacitive receiver, through an interconnect medium within the cable, wherein the transmitter includes at least one of a driver or a transmit buffer that is configured with a size that is set corresponding to a length of the cable; and
an out-of-band communication mechanism within the cable and an out-of-band communication mechanism within the integrated circuit chips, wherein the cable and the integrated circuit chips use the out-of-band communication mechanisms to negotiate which pad pitches, pad locations, and signaling rates for facilitating communication between the integrated circuit chips and the first active connector;
wherein the capacitive receiver is not permanently attached to the capacitive transmitter in the first integrated circuit chip, whereby the cable can be easily remated to other integrated circuit chips.

* * * * *